United States Patent [19]
Urakami et al.

[11] Patent Number: 5,353,149
[45] Date of Patent: Oct. 4, 1994

[54] APPARATUS FOR AFFECTING TIME-SPACE CONVERSION ON A LIGHT SIGNAL CHANGING AT ULTRA-HIGH SPEED

[75] Inventors: Tsuneyuki Urakami; Teruo Hiruma, both of Hamamatsu, Japan

[73] Assignee: Hamamatsu Photonics K.K., Hamamatsu, Japan

[21] Appl. No.: 121,899

[22] Filed: Sep. 16, 1993

[30] Foreign Application Priority Data

Sep. 17, 1992 [JP] Japan .................................. 4-248075
Sep. 17, 1992 [JP] Japan .................................. 4-248077

[51] Int. Cl.$^5$ .............................................. G02F 1/35
[52] U.S. Cl. ................................. 359/326; 359/328
[58] Field of Search ............................... 359/326–332; 385/122; 372/21, 22

[56] References Cited

U.S. PATENT DOCUMENTS

| | | | |
|---|---|---|---|
| 4,413,905 | 11/1983 | Holzapfel | 359/328 X |
| 5,075,573 | 12/1991 | Huignard et al. | 359/326 |
| 5,144,636 | 9/1992 | Yoshida et al. | 359/328 X |

OTHER PUBLICATIONS

H. Takara et al., "Very–High–Speed Optical Sampling Oscilloscope", NTT R&D, vol. 40, No. 6, 1991, pp. 823–834, (no month).

*Primary Examiner*—John D. Lee
*Attorney, Agent, or Firm*—Cushman, Darby & Cushman

[57] ABSTRACT

An optical converter is so arranged that light to be measured and probe light are made to interact with each other on a nonlinear element and that mixed light produced by the interaction is detected, which is characterized in that an energy amount of interacting signal light is kept as high as possible without spatial expansion of signal light, which could lower the SN ratio. For this, the time-space conversion function is achieved by a method for producing the probe light. Namely, the optical converter comprises (a) a nonlinear element for making two types of light interact with each other to cause the nonlinear optical effect, (b) a device for guiding light to be measured to the nonlinear element, and (c) a device for producing probe light crossing the light to be measured on the nonlinear element and changing a traveling direction of probe light with change of crossing time. A light waveform measuring apparatus or an optical serial-parallel converter may be attained by adding to the optical converter (d) a device for detecting mixed light produced by the interaction between the signal light and the probe light on the nonlinear element.

25 Claims, 11 Drawing Sheets

ILLUSTRATION OF BASIC OPERATION
IN OPTICAL SERIAL-PARALLEL CONVERTER

EXAMPLE OF AMP FOR MEASURED LIGHT

EXAMPLE OF MEASURED LIGHT ARRIVAL DETECTOR

LIGHT WAVEFORM MEASURING APPARATUS IN THIRD EMBODIMENT

CONSTITUTION OF OPTICAL SERIAL-PARALLEL CONVERTER IN FIRST EMBODIMENT 421  422₁~422₇  424₁~424₈
     423₁~423₈ t = 50psec
d = 1mm 421  423₁~423₈  425₁~425₈
     424₁~424₈ t = 50psec
d = 1mm t = 50 psec
d = 1 mm

CONSTITUTION OF OPTICAL SERIAL-PARALLEL
CONVERTER IN FIFTH EMBODIMENT

APPARATUS FOR AFFECTING TIME-SPACE CONVERSION ON A LIGHT SIGNAL CHANGING AT ULTRA-HIGH SPEED

BACKGROUND OF THE INVENTION

1. Field of the Invention

The present invention relates to an apparatus for effecting time-space conversion on a light signal changing at ultra high speed.

2. Related Background Art

Recent progress is remarkable in technology for producing ultrashort pulses, so that stable pulses of less than a pico second can be obtained at present. Such ultrashort pulses may be used as light source for time resolved spectroscopy, for nonlinear spectroscopy, or for high-speed optical communication.

A waveform of naturally existing light or artificially produced light includes various useful information. Precise observation of the waveform enables deeper recognition and more precise understanding of natural phenomena. There are two types of methods for measuring a waveform of a light signal, roughly classified as follows.

(1) Method utilizing the linear photo-electronic conversion (2) Method utilizing the nonlinear optical effect The former is a method for measuring a waveform in which a light signal is converted into an electric signal or a charge signal by a photodetector utilizing the photoelectric conversion and then the detected signal is measured on an oscilloscope. In this method, the photodetector may be a photodiode, a photo tube, a photomultiplier or a streak tube. Among the alternatives listed, a streak camera using the streak tube is highest in speed, and presently commercially available streak cameras have a time resolution of 600 fsec.

The latter is a method for measuring a waveform of light to be measured in which a suitable delay is given between light to be measured (signal light) and probe light, in which the two types of light are combined on a nonlinear crystal to obtain a harmonic light, and in which a waveform is obtained from the intensity of harmonic light with the parameter of delay amount. This method is substantially a sampling method for measuring a waveform of repetitive waves, but can also be used for real time waveform measurement of single pulse light by spatially expanding the light to be measured and the probe light and superimposing them on each other while giving spatially different delay times therebetween (Norimoto Kawanishi et al., "Measurement of ultra-high-speed light pulse by optical sampling technique", research materials, instrumentation research group at Institute of Electrical Engineers of Japan, IM-89-15, May 30, 1989; Japanese Patent Publication No. 2-259435; Kazuhiro Ema et al., "Ultra-high-speed light waveform measuring method using waveform shaping, and its applications", annual reports of general research institute, vol. 50 (1991), the University of Tokyo, Department of Technology ).

SUMMARY OF THE INVENTION

It is a first object of the present invention to provide an optical converter for effecting time-space conversion at excellent SN ratio on light to be measured (signal light) changing at high speed.

It is a second object of the present invention to provide an inexpensive light waveform measuring apparatus for measuring a waveform at excellent SN ratio and at high time resolution.

It is a third object of the present invention to provide an optical serial-parallel converter in which a high-speed light serial signal carrying information is converted into a parallel electric signal at excellent SN ratio and at low cost.

An optical converter of the present invention is so arranged that light to be measured and probe light are made to interact with each other on a nonlinear element and that the mixed light produced by the interaction is detected, which is characterized in that the energy amount of interacting signal-light is kept as high as possible without spatial expansion of signal light, which could be a factor in degrading the SN ratio. For this, the time-space conversion function is realized by the method for producing the probe light. Namely, the optical converter according to the present invention comprises (a) a nonlinear element for making two types of light interact with each other to cause the nonlinear optical effect, (b) means for guiding light to be measured to the nonlinear element, and (c) means for producing probe light crossing the light to be measured on the nonlinear element and changing a traveling direction of probe light with a change of the crossing time. A light waveform measuring apparatus or an optical serial-parallel converter may be attained by adding to the optical converter (d) means for detecting mixed light produced by the interaction between the signal light and the probe light on the nonlinear element.

In the optical converter of the present invention, the light to be measured is used as it is, and interacts on the nonlinear element with the probe light of short pulses at different cross angles and at different times as the light to be measured advances with time. The outgoing light produced by the interaction reflects the time spread of waveform of the light to be measured as a spatial spread. The above operational effect is further described with reference to the drawings.

FIG. 1 is an explanatory drawing to show the operation in the main part of a light waveform measuring apparatus using an optical converter of the present invention, in which light to be measured and probe light interact with each other in a nonlinear element and a time waveform of the light to be measured is spatially expanded. The probe light is pulse light which has a spatial spread oblique to the traveling direction and a time delay depending upon a spatial position (x) before it is focused by a convex lens. The pulse light may be produced by various methods, for example by directing short pulse light spatially spreading normal to the traveling direction from a light source toward a diffraction grating to effect diffraction thereof, by moving a light source in the direction normal to the traveling direction, or by arranging a plurality of light sources on a line and sequentially turning on and off the light sources. The light pulses thus produced may be expressed by following Equation (1).

$$E(t, x) = R(x) \cdot V(t-\alpha x) \qquad (1)$$

where $E(t, x)$: a time-space distribution of probe light;
$R(x)$: a function representing a space distribution of probe light;
$V(t)$: a function representing a time distribution of probe light;
$\alpha$: a time delay rate depending upon a spatial position.

The probe light is focused on the nonlinear element by a convex lens. Since a convex lens functions as a spatial Fourier transform, the probe light focused on the nonlinear element differs its arrival time at the nonlinear element depending upon its incident direction.

The probe light and the light to be measured are superimposed on each other on the nonlinear element to interact with each other. For simplicity, the nonlinear element used herein is a SHG (second harmonic generation) element having the second-order nonlinear optical effect. The SHG element determines the exit direction of light produced by the interaction between the two incident light beams by the phase matching condition. The exit direction of the interaction light produced by the SHG element is a direction of a vector obtained by adding two vectors representing the two incident light beams. The incident direction of the light to be measured into the nonlinear element is fixed, while the incident direction of the probe light into the nonlinear element differs depending upon the arrival time at the nonlinear element. Thus, the outgoing light caused by the interaction in the SHG element leaves the element in different directions with respect to time. If the intensity of probe light is constant independent of the incident direction into the nonlinear element, the interaction light leaves the element with a distribution of intensity in the exit direction depending upon the time distribution of intensity of the light to be measured (waveform itself of the light to be measured). This distribution in the exit light direction is converted into a spatial distribution by a convex lens, so that the time waveform of the light to be measured is spatially expanded. A light waveform may be detected by receiving and measuring the light obtained by thus spatially expanding the waveform of the light to be measured by means of a photodetector one-dimensionally aligned. Although the intensity of probe light is constant independent of the incident direction into the nonlinear element in this example, probe light with intensity distribution may be used if the intensity distribution is known and if the measured waveform is corrected by the known intensity distribution. Also, the nonlinear element is described as SHG element in this example, but an element having the third-order nonlinear optical effect may also be employed to enable the time-space conversion in the same manner. In addition, since the generation of mixed light is proportional to the intensity of incident light, the SN ratio may be improved by amplifying the light to be measured.

FIG. 2 is an explanatory drawing to show the operation in the main part of an optical serial-parallel converter using an optical converter of the present invention, which shows an example in which signal light and probe light interact with each other in a nonlinear element, whereby a time waveform of signal light (showing presence or absence of pulse at certain time) is spatially expanded and 4 bit serial data is converted into 4 bit parallel data. The signal light includes transmission information expressed as presence or absence of pulse light at each basic cycle ($t_o$), which impinges on a nonlinear element 1 as it is or after simply amplified. Probe light pulses ($k_i \cdot p$; $i = 1-4$), the number of which is identical to that of parallelized bits, are made impinging on the interaction point (P) in different incident directions for respective probe light pulses. The probe light pulses serially arrive at the interaction point (P) at intervals of basic cycle ($t_o$) of signal light, and are adjusted by probe light generating means such that if there is a pulse in signal light a probe pulse arrives at the interaction point (P) at the same time as the pulse in signal light does.

The probe light pulses and the signal light are superimposed on each other on the nonlinear element 1 to interact with each other. For simplicity, the nonlinear element used herein is a SHG element having a second-order nonlinear effect. The nonlinear element 1 determines by the phase matching condition the exit direction of light produced by the interaction between the two incident light beams. Namely, the exit direction of the interaction light produced in the nonlinear element 1 is a direction of a vector obtained by adding two vectors representing the respective directions of two incident light beams. The incident direction of signal light into the nonlinear element 1 is fixed, while the incident direction of probe light into the nonlinear element 1 differs depending upon the arrival time at the nonlinear element 1. Thus, the outgoing light caused by the interaction in the nonlinear element 1 leaves the element in different directions with respect to time. If the intensity of probe light is constant independent of the incident direction into the nonlinear element 1, the outgoing light produced by the interaction leaves the element with a distribution of intensity in the exit direction depending upon the time distribution of intensity of signal light (that is, depending upon presence or absence of pulse at certain time). The thus produced outgoing light is received and measured by photodetectors $2_1$–$2_4$, thereby achieving an optical serial-parallel converter. Although the nonlinear element 1 was described herein as a SHG element, an element having the third-order nonlinear effect may also be employed in the same manner.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention are intended to be included within the scope of the appended claims.

DESCRIPTION OF THE PREFERRED EMBODIMENTS

Figure 1:
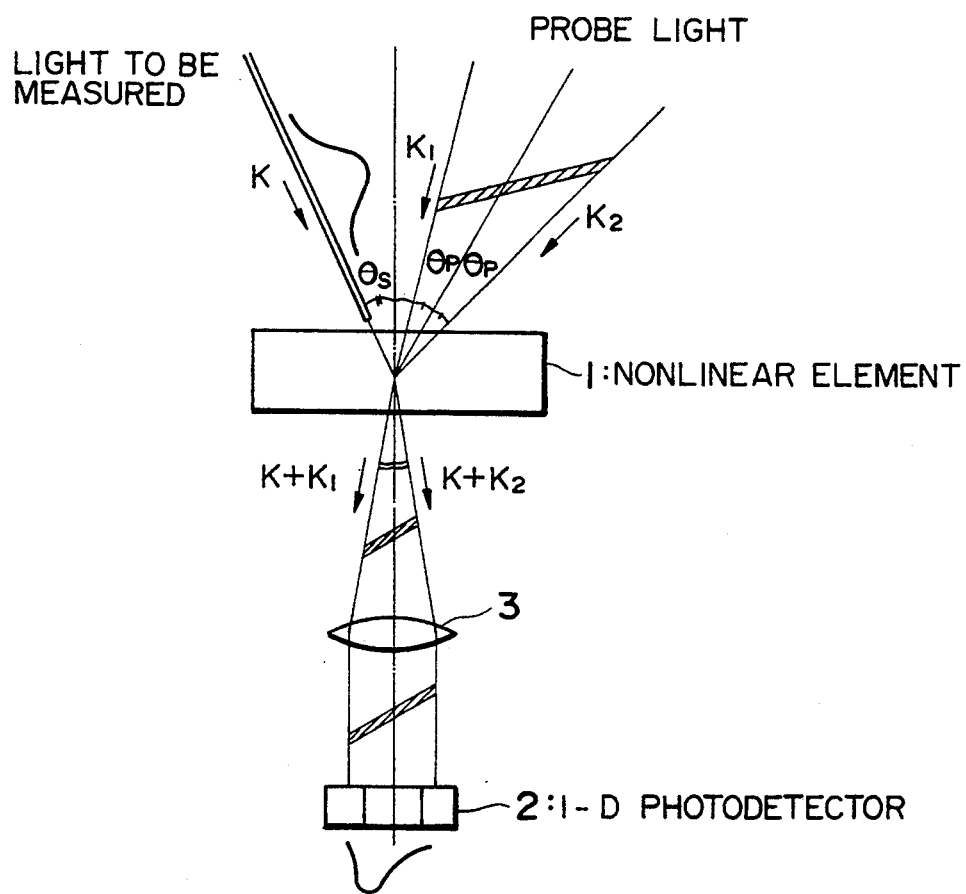
FIG. 1 is an explanatory drawing showing the operation in the main part of a light waveform measuring apparatus according to the present invention.
Figure 2:
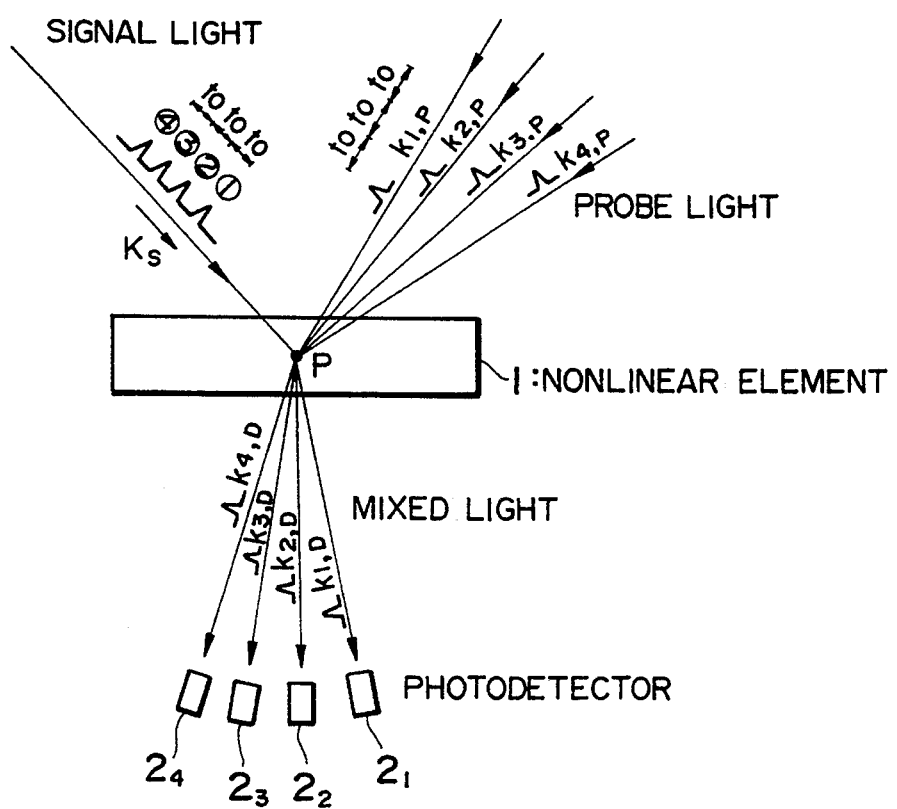
FIG. 2 is an explanatory drawing showing the basic operation in an optical serial-parallel converter according to the present invention.

The embodiments of the present invention will be described in detail with reference to the accompanying drawings. Elements will be denoted by the same reference numerals in the drawings, and duplicate description will be omitted.

There will be described in the following embodiments light wave measuring apparatus and optical serial-parallel converter utilizing the optical converter of the present invention.

First Embodiment of Light Waveform Measuring Apparatus

Figure 3:
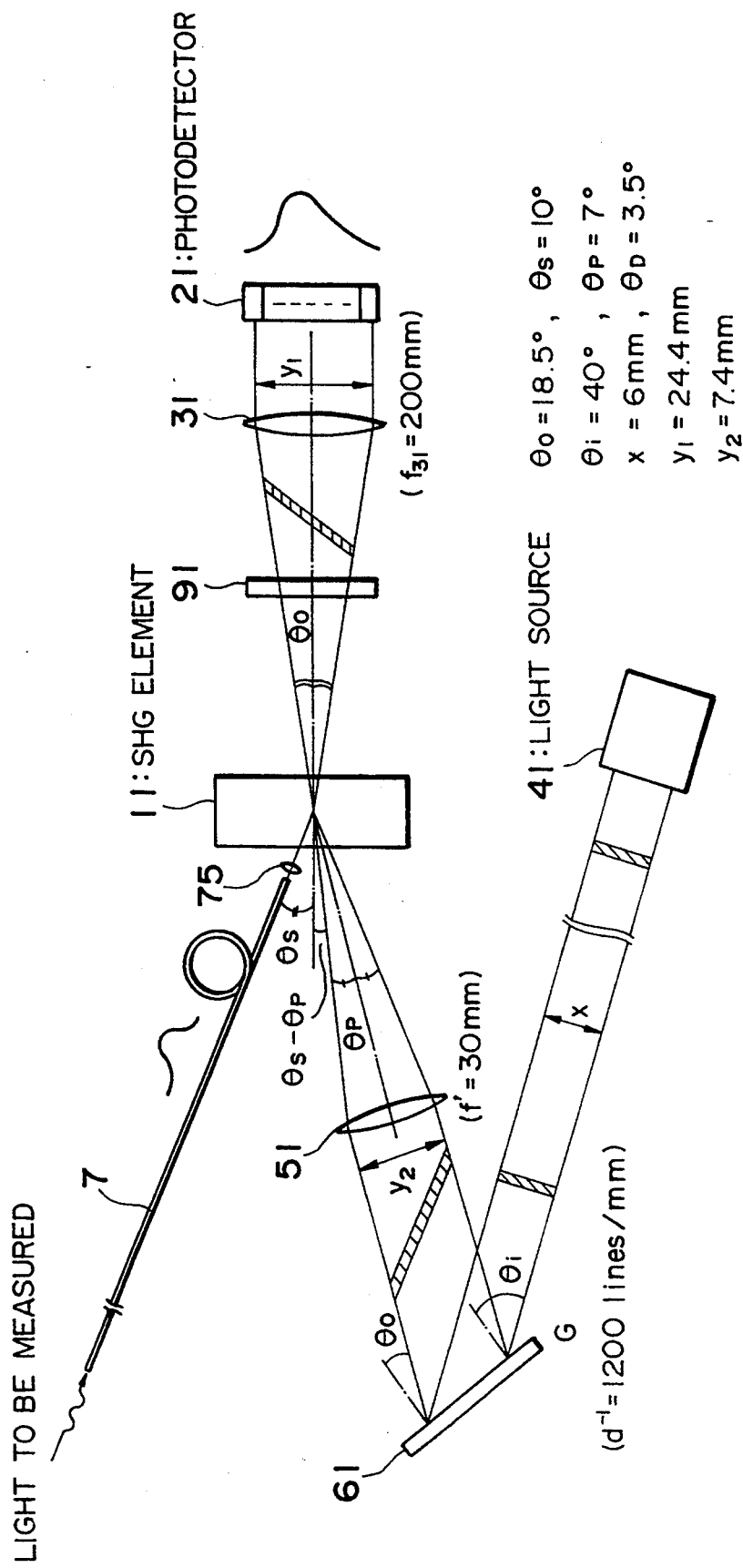
FIG. 3 is a drawing showing a first embodiment of the light waveform measuring apparatus according to the present invention.

FIG. 3 shows the basic construction of the first embodiment of light waveform measuring apparatus according to the present invention. This apparatus is constituted by a SHG element 11 having a second-order nonlinear optical effect, an optical fiber 7 for guiding light to be measured to the vicinity of the SHG element 11, a lens 75 for focusing light leaving the optical fiber 7 on the SHG element 11, a light source 41 for emitting light of parallel pulses at intervals of about 6 mm and with a spatial spread normal to the traveling direction, a diffraction grating 61 (grating constant $d^{-1}=1200$ lines/mm) for diffracting the light from the light source 41 to produce diffracted light with inclined wavefront, a convex lens 51 (aperture=about 7.5 mm; focal length=30 mm) for focusing the diffracted light at an interaction point on the SHG element 11, a wavelength filter 91 transmitting only output light from the SHG element 11 which was produced by the interaction between the light to be measured and the probe light on the SHG element, a convex lens 31 (aperture=about 27 mm; focal length=200 mm) for collimating the light passing through the wavelength filter 91, and a photodetector 21 composed of a photodiode array including 512 ch photodiodes arranged at intervals of 50 μm.

The light to be measured is guided through the optical fiber 7 to impinge on the SHG element 11. The diffraction grating diffracts the pulse light emitted from the light source 41 while having a spatial spread normal to its traveling direction, so that an angle of its wavefront to the traveling direction is changed from 90 degrees. Equations related to the diffraction are as follows.

$$\sin \theta_i + \sin \theta_o = \lambda/d \tag{2}$$

$$\theta_o = \sin^{-1}(\lambda/d - \sin \theta_i) \tag{3}$$

$$a[\sec/m] = \lambda \cdot s/(c \cdot d \cdot \cos \theta) \tag{4}$$

In the above equations, $\theta_i$: an incident angle into the diffraction grating;
$\theta_o$: an outgoing angle from the diffraction grating;
$\lambda$: a wavelength of pulse light;
$s = \cos \theta_i / \cos \theta_o$;
$c = 3 \times 10^8$ [m/sec]: speed of light.

$$y_2 = x/s \tag{5}$$

In the above equation, x: a diameter of light beam from the light source;
$Y_2$: a diameter of the outgoing beam from the diffraction grating.

In the present embodiment, $\theta_i = 40°$, $d^{-1} = 1200$ [lines/mm] and $\lambda = 800$ [nm] as shown in FIG. 3. Thus,
$\theta_o = 18.5°$;
$a = 3.4 \times 10^{-9}$ [sec/m];
$y_2 = 7.4 \times 10^{-3}$ [m].

Accordingly, a delay time ($T_d$) in outgoing beam from the diffraction grating is as follows.

$$T_d = a \cdot y_2 = 25 \text{ [psec]}$$

Real time measurement is possible with a time intensity distribution of measured light having a delay time up to this value.

The above beam is focused by the convex lens 51 (focal length ($f_{51}$) = 30 [mm]) on the SHG element 11 to produce probe light rays different in traveling direction depending upon arrival time at the SHG element 11. An incident angle of conical surface of the probe light into the SHG element 11 is inclined at an angle $\pm\theta_P$ to the optical axis of the converging beam, as shown in FIG. 3. The angle $\theta_P$ is calculated as follows.

$$\theta_P = \tan^{-1}(y_2/2f_{51}) = 7°$$

The exit direction of output light produced by the interaction between the light to be measured and the probe light on the SHG element 11 is the direction of a vector obtained by adding a traveling direction vector of the light to be measured and a traveling direction vector of the probe light. A change in traveling direction of the measured light focused by the lens 75 may be ignored. As the probe light has a spread of traveling direction in the angle ($\pm\theta_P$), the output light has a spread of exit direction from the SHG element 11. The following relation holds between the spread angle ($\theta_D$) of output light and the spread angle ($\theta_P$) of probe light.

$$\theta_P = 2\theta_D \tag{6}$$

Accordingly, the output light leaves the SHG element 11 in the range of $\theta_D = \pm 3.5°$.

A point to be considered is that the light to be measured or the probe light could be mixed with the output light in the outgoing range thereof. The following relation shows a condition to avoid the mixture of non-interacted light to be measured and probe light into the outgoing range of output light produced by the interaction.

$$\theta_S > 3\theta_P/2 = 3\theta_D \quad (7)$$

where $\theta_S$: a medial magnitude of the angle between the light to be measured and the center axis of the optical path of probe light.

Although the incident angle of the light to be measured into the SHG element 11 is $\theta_S$ in the example of FIG. 3, this is not essential in the light waveform measuring apparatus of the present invention. Such arrangement, however, permits the output light from the SHG element to spread about the center of the direction normal to the exit plane of the SHG element 11. This simplifies the positional relation of components, whereby the production of apparatus becomes easier. If the arrangement does not satisfy the above condition, means for measuring only the output light should be employed, for example means for guiding only the output light to the photodetector through a transmitted light wavelength selection filter, or a wavelength selective photodetector. In this embodiment, $\theta_S = 10°$ and $\theta_p = 7°$. Thus, $$\theta_S = 10° < 3\theta_P/2 = 3\theta_D = 10.5°$$

Since the condition of Equation (7) is not satisfied in this example, a filter 91 is provided in the traveling path of the output light.

The output light is collimated by the convex lens 31 (focal length ($f_{31}$)=200 [mm]) to convert the directional spread into a spatial spread. The thus obtained beam spread ($y_1$) is as follows.

$$y_1 = 2f_3 \cdot \tan 3.5° = 24.4 \text{ [mm]}$$

The intensity of thus collimated output light is measured by the photodetector 21. The photodetector 21 is a photodiode array, in which 512 photodiodes, each of which has a width (t) of 50 [μm] as unit of photo detection, are one-dimensionally arranged. Thus, the total width of photodetector 2 is 25.6 [mm], which is enough to cover the spatial spread of the collimated output light.

Figure 4:
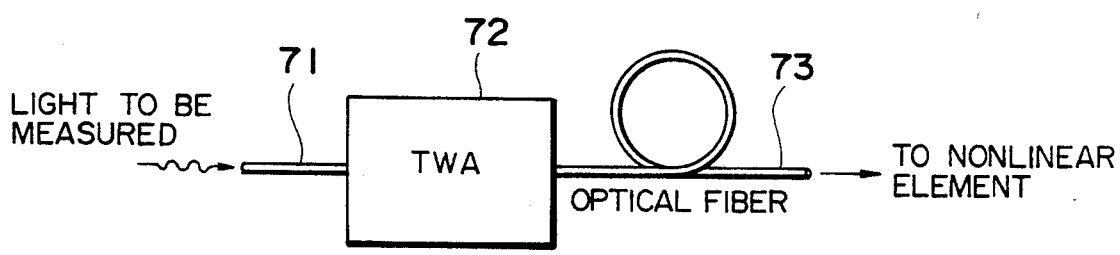
FIG. 4 is a drawing showing an example of a measured light amplifier.

In the present embodiment the intensity of output light outgoing from the SHG element 11 is proportional to the intensity of the light to be measured, and therefore the SN ratio may be improved in measurement by optically amplifying the light to be measured on the way of wave guide to the vicinity of the SHG element 11. FIG. 4 shows an example of amplification of the light to be measured, in which a semiconductor light amplifier (TWA) 72 is provided between optical fibers 71 and 73 for guiding the light to be measured. The optical amplifier may be an Er-doped optical fiber amplifier or an optical parametric amplifier.

Figure 5:
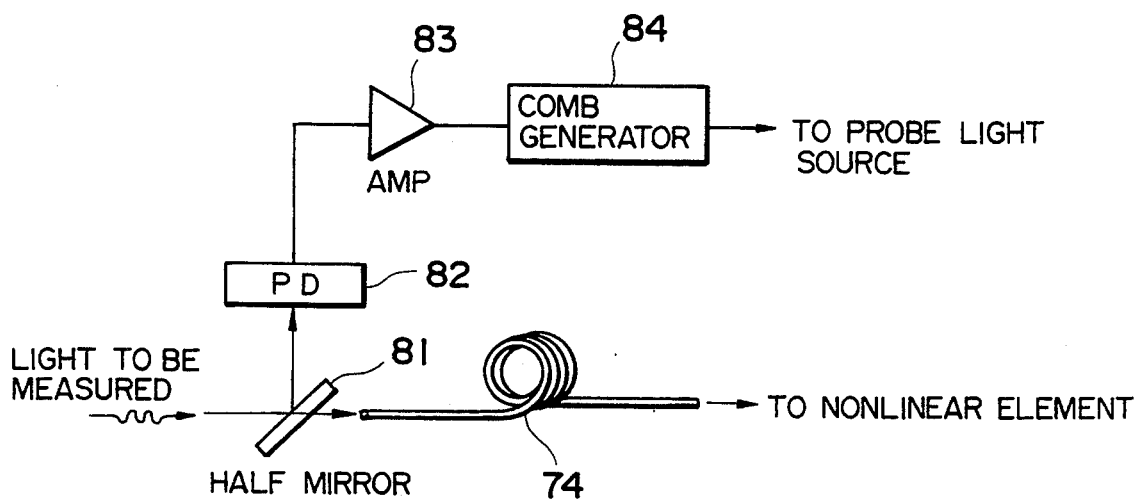
FIG. 5 is a drawing illustrating an example of a measured light arrival detector.

It is preferable in order to efficiently measure a waveform of light that while the arrival of the measured light ( especially the measurement-intended portion) is detected the probe light is made incident into the SHG element 11 in synchronism with the irradiation of measured light onto the SHG element 11. FIG. 5 shows an example of the synchronization method. The measured light is split into two beams by a half mirror 81. One beam is guided to enter a photodiode (PD) 82 to monitor arrival of the measured light. An output electric signal of the PD 82 is amplified and shaped through an amp 83 and a comb generator 84 to be used for driving light source 41. The other beam split by the half mirror 81 is given a delay by an optical fiber 74 to adjust a timing of arrival at the SHG element 1 for synchronization with the probe light. The delay means for adjusting the arrival timing of the measured light at the SHG element 11 may be a combination of mirrors.

If a time width of measurement-intended portion in the light to be measured is not less than $T_d$, real time measurement is possible for its waveform. $T_d$ is adjustable by changing a beam diameter (x) of the beam emitted from the light source 41, an incident angle ($\theta_i$) of the beam from the light source 41 into the diffraction grating, or the grating constant-($d^{-1}$) of the diffraction grating.

The light source of the probe light may be for example a mode-locked titanium-sapphire laser, a mode-locked LiSAF laser, or a mode- locked LD.

The SHG element is a crystal of $NH_4H_2PO_4$(ADP), $KTiOPO_4$ (KTP), $KH_2PO_4$ (KDP), $KD_2PO_4$(KD*P), $CsD_2ASO_4$ (CD*A), $RbH_2PO_4$ (RDP), CO $(NH_2)_2$ (urea), $LiNbO_3$, $\beta$-$BaB_2O_4$ (BBO), $CdGeAs_2$, Te, $BaNaNb_5O_{15}$, $C_6NH_2NO_2$(MNA), $LiIO_3$, etc. In addition, a polymer (colona-poled 3RDCVXY) recently reported may be also used, which has a second-order nonlinear susceptibility $\chi^{(2)}$ being a huge number in the order of $10^{-6}$ esu.

Second Embodiment of Light Waveform Measuring Apparatus

Figure 6:
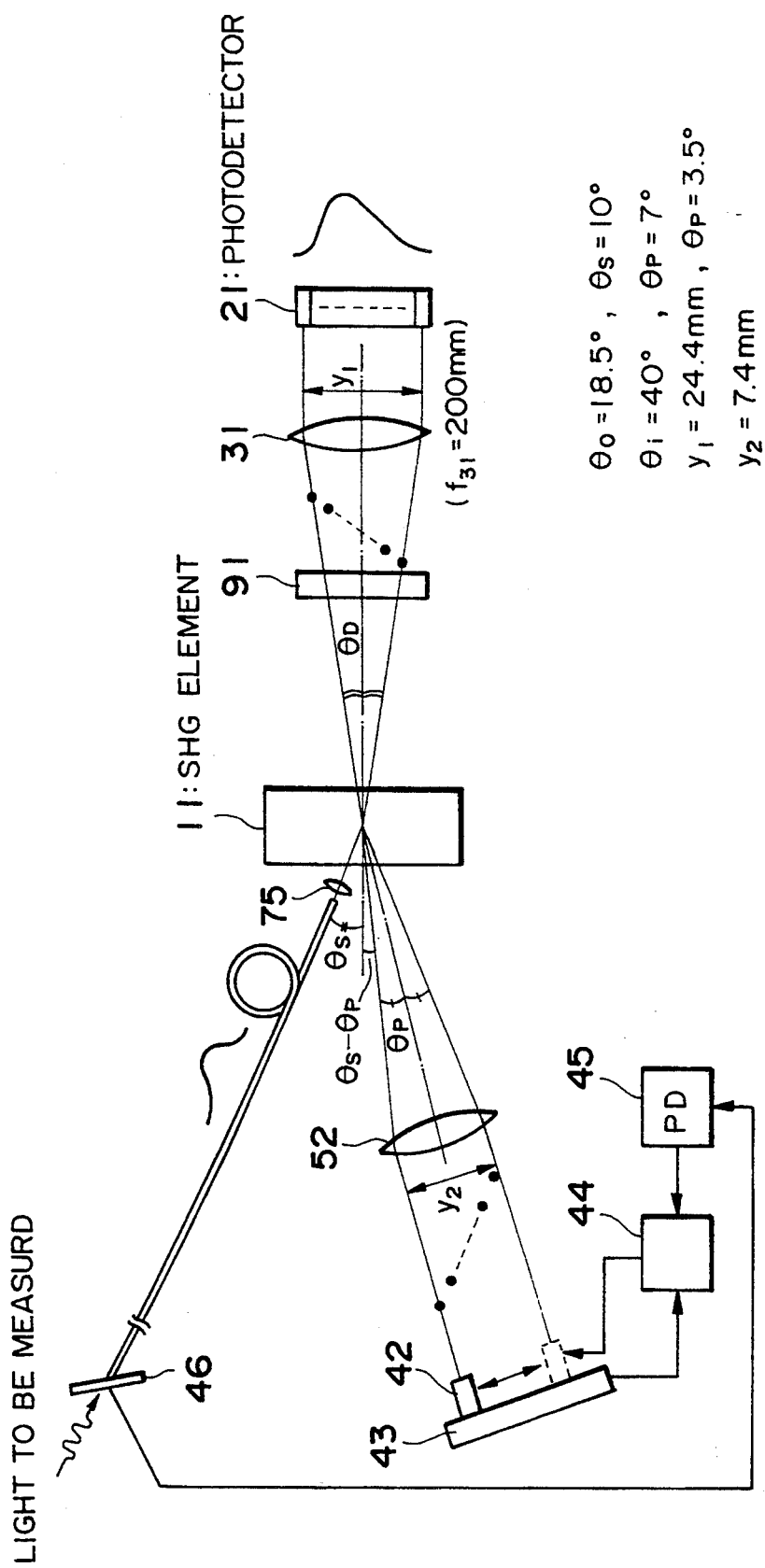
FIG. 6 is a drawing depicting a second embodiment of the light waveform measuring apparatus according to the present invention.

The construction of the second embodiment is the same as that of the first embodiment except for the production of probe light, as shown in FIG. 6. In the present embodiment the probe light is produced by a light source 42 for emitting light of short pulses with shorter time width than the time width of the measurement-intended wave in the light to be measured, a stage 43 for enabling the light source 42 to move in the direction normal to the light emission direction of light source 42 and for detecting and outputting a position where the light source 42 is emitting light, a half mirror 46 for separating a part of the measured light therefrom, a photodiode 45 for detecting the separate part of light, a light emission control apparatus 44 for producing an emission timing and a drive signal of light source 42 from the information on light emitting position of light source 42 output from the stage 43 and the information on arrival of measured light output from the photodiode 45, and a convex lens 52 for guiding the short pulse light emitted from the light source 42 to the interaction point on the SHG element 11.

Since the probe light passes through the convex lens 52, the incident angle of probe light into the interaction point on the SHG element 11 differs depending upon the light emitting position of light source 42. The light emission control apparatus 44 acts to differ the time between the arrival detection of measured light and the light emission depending upon the light emitting position of light source 42. Accordingly, the interaction on SHG element 11 between probe light and light to be measured in the present embodiment results in production of output light having the same spatial distribution as in the first embodiment, whereby light waveform measurement can be carried out at the same time resolution as in the first embodiment of light waveform measuring apparatus. The present embodiment is suitable for measurement of repetitive waveforms.

In this apparatus, the probe light may be produced by using a plurality of light sources one-dimensionally arranged as independently actuated, instead of the moving light source, and controlling the time between the arrival detection of measured light and the pulse light emission depending upon a location of each light source. This arrangement enables the waveform measurement of single pulse in addition to the measurement of repetitive waveforms.

Third Embodiment of Light Waveform Measuring Apparatus

Figure 7:
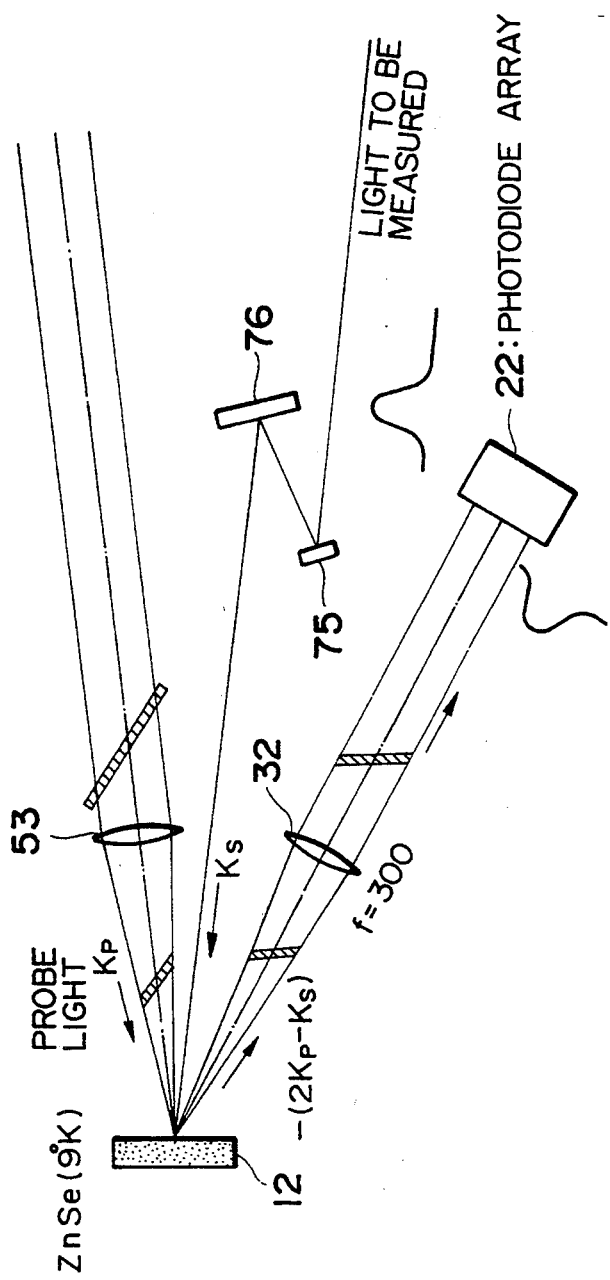
FIG. 7 is a drawing illustrating a third embodiment of the light waveform measuring apparatus according to the present invention.

FIG. 7 shows the basic construction of the present embodiment. This embodiment utilizes the third-order nonlinear optical effect, different from the first and the second embodiments of light waveform measuring apparatus as described. The apparatus in this embodiment is constituted by a ZnSe crystal element 12 having the third-order nonlinear optical effect, mirrors 75, 76 for guiding the light to be measured to the vicinity of the nonlinear element 12, probe light producing means, a convex lens 32 for collimating four-waves-mixed light produced by the interaction on the ZnSe crystal element 12 due to the third-order nonlinear effect, and a photodetector 22 comprised of a photodiode array for detecting an intensity distribution of four-waves-mixed light. The ZnSe crystal element 12 is cooled at about 9° K, has a large $\chi^{(3)}$ (approximately $10^{-2}$ esu) because of resonance of excitons, and is used at a very fast response speed of 20–30 [psec]. Similarly as in the first embodiment, the probe light generating means is constituted by a light source (not shown) for generating pulse light having a spatial spread normal to its traveling direction, a diffraction grating (not shown) for diffracting the light emitted from the light source to produce diffracted light with a spatial spread being inclined to the direction normal to the traveling direction, and a convex lens 53 for focusing the diffracted light at the interaction point on the ZnSe crystal. A wavelength of the light emitted from the light source is 442 [nm], which has exciton resonance in ZnSe.

Four-waves-mixed light of reflection type having the exit direction ($k_D$) from the ZnSe crystal as defined by the following equation is measured out of the four-waves-mixed light.

$$k_D = -(2k_P - k_S) \quad (8)$$

where $k_D$: an exit direction vector of four-waves-mixed light;

$k_P$: an incident direction vector of probe light;

$k_S$: an incident direction vector of light to be measured.

In the present embodiment $k_S$ is constant similarly as in the first embodiment of light waveform measuring apparatus while $k_P$ changes with time, whereby four-waves-mixed light leaves the crystal with a distribution of intensity in the exit direction depending upon a time distribution of intensity of the light to be measured (waveform itself of the measured light), as apparent from Equation (8). This distribution in the exit light direction is converted into a spatial distribution by the convex lens 32, whereby the time waveform of measured light is spatial by expanded. The photodetector 22 with photodiodes one-dimensionally aligned receives and measures the four-waves-mixed light as the thus spatially expanded waveform of measured light, whereby the light waveform measurement can be carried out substantially at the same precision as in the first embodiment of the light waveform measuring apparatus.

The present embodiment may include additional devices such as the measured light amplifier in FIG. 4 and the measured light arrival detector in FIG. 5, which could be added to the first embodiment of the light waveform measuring apparatus, with the same effect as in the first embodiment of the light waveform measuring apparatus. Since many of media having the second-order nonlinear optical effect simultaneously have the third-order nonlinear optical effect, they may be used instead of the above ZnSe crystal.

First Embodiment of Optical Serial-Parallel Converter

Figure 8:
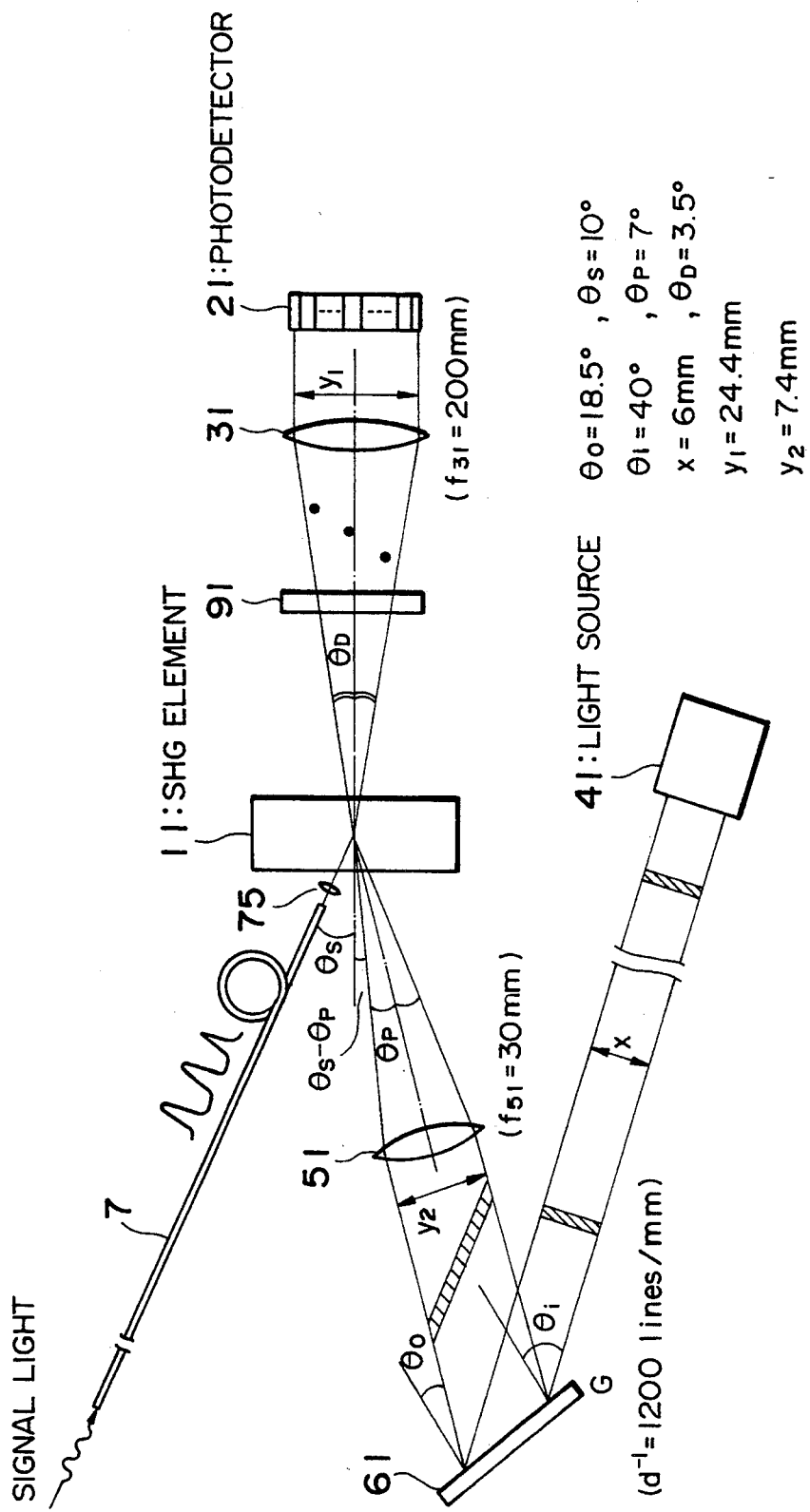
FIG. 8 is a drawing showing a first embodiment of the optical serial-parallel converter according to the present invention.

FIG. 8 is a drawing illustrating an optical serial-parallel converter according to the present embodiment. As shown, the apparatus is constructed in the same manner as in the first embodiment of light waveform measuring apparatus. Namely, the present embodiment is an example in which the first embodiment of light waveform measuring apparatus is used as an optical serial-parallel converter. Accordingly, the apparatus in the present embodiment is operated in the same manner as the first embodiment of light waveform measuring apparatus, in which time-space conversion is effected on a serial light signal as the light to be measured, which is a time-serial signal of binary data, to obtain a parallel light signal, which is detected by a photodetector 21. Thus, information can be read from the serial light signal having a further higher signal speed than the response speed of respective photo detecting elements constituting the photodetector 21. The apparatus of the present embodiment can be modified for example to have an amplifying system for signal light in the same manner as in the first embodiment of light waveform measuring apparatus as described above.

Second Embodiment of Optical Serial-Parallel Converter

Figure 9:
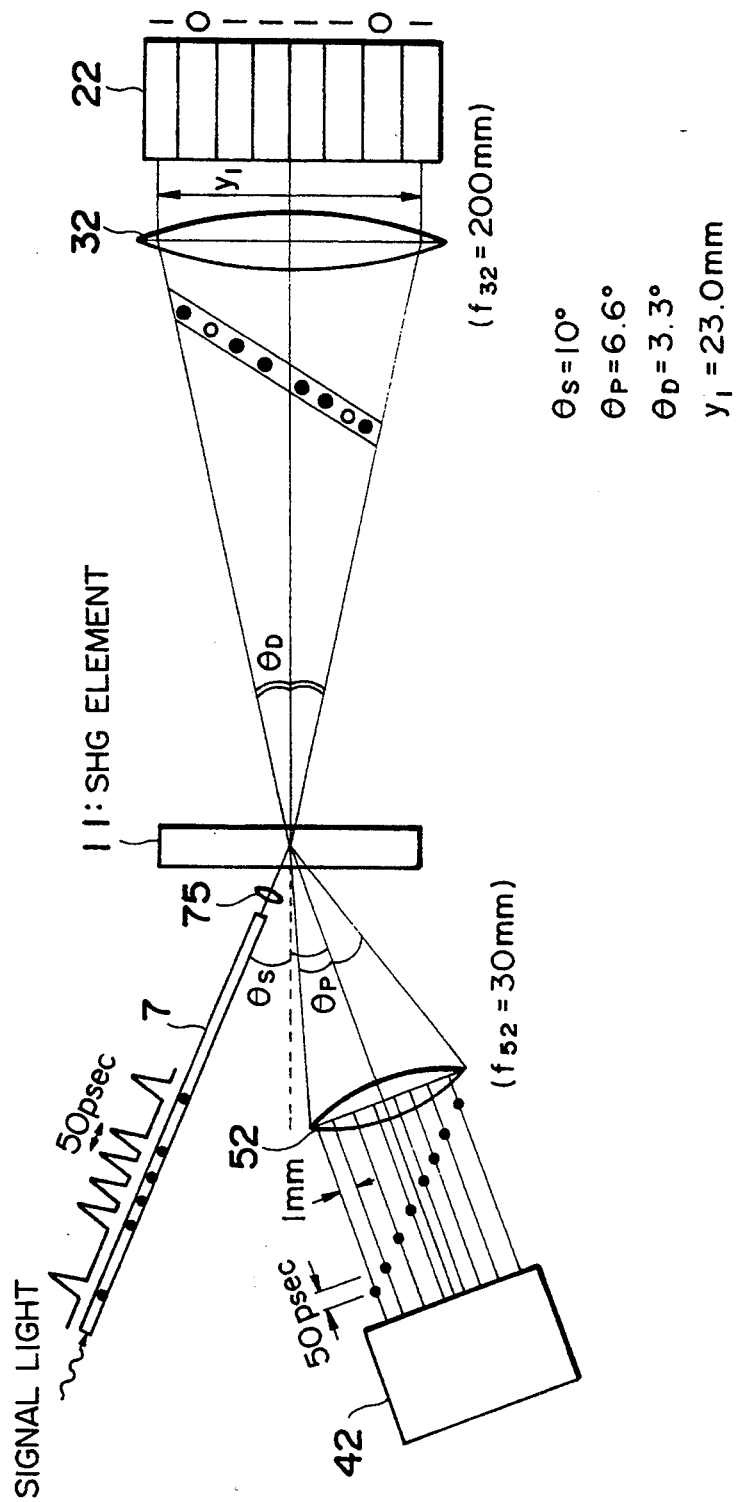
FIG. 9 is a drawing illustrating the basic construction of the optical serial-parallel converter for second to fourth embodiments according to the present invention.

FIG. 9 shows the basic construction of the second embodiment of an optical serial-parallel converter according to the present invention. This apparatus has a basic cycle of signal light of 50 [psec] and a parallelized bit width of 8, which is constituted by a SHG element 11 having the second-order nonlinear optical effect, an optical fiber 7 for guiding signal light to the vicinity of the SHG element 11, a pulse light emitter 42 for sequentially emitting eight short pulses at time intervals of 50 [psec] in parallel with each other in the traveling direction, a convex lens 52 (aperture=about 7.5 mm; focal length=30 mm) for converging the light of parallel pulses at the interaction point on the SHG element 1, a convex lens 32 (aperture=about 25 mm; focal length=200 mm) for collimating mixed light produced by the interaction on the SHG element between the pulses of signal light and the probe light and then outgoing from the SHG element, and a photodetector 22 composed of an APD array of eight avalanche photodiodes one-dimensionally arranged at intervals of 3.3 mm. A convex lens 75 is provided at the exit of optical fiber 7 also in the present embodiment, similarly as in the first embodiment of optical serial-parallel converter, which focuses the light outgoing from the optical fiber 7 at the interaction point on the SHG element.

Figure 10:
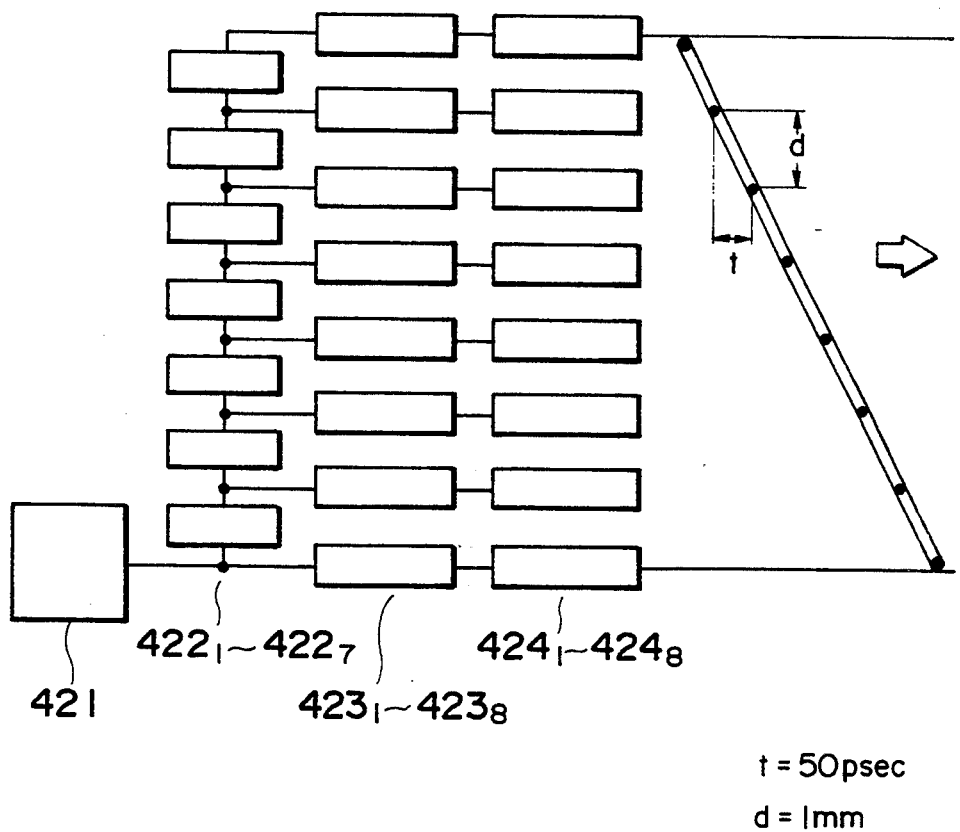
FIG. 10 is a drawing depicting a probe light pulse emitter for an optical serial-parallel converter in the second embodiment according to the present invention.

The pulse light emitter 42 is constituted as shown in FIG. 10. FIG. 10 shows an example of a method for driving the eight laser diodes at a certain timing, in which a reference clock generator 421 (cycle=400 [psec]=basic cycle of signal light (=50 [psec])×parallelized bit width (=8)), seven time delay circuits $422_1$–$422_7$ (delay time=50 [psec]) eight comb generators $423_1$–$423_8$ receiving pulses different in delay time, i.e., pulses delayed by 50 [psec] for each one after another electric signal delay circuit $422_1$–$422_7$, and laser diodes $424_1$–$424_8$ driven by the respective comb generators $423_1$–$423_8$ are combined as shown.

The signal light is guided through the optical fiber 7 to irradiate the SHG element 11. The light of eight parallel pulses emitted from the pulse light emitter 42 is focused on the SHG element 11 by the convex lens 5 (focal length ($f_5$)=30 [mm]) to produce probe light beams in different traveling directions depending upon arrival time at the SHG element 11. The incident angle of conical surface of the probe light into the SHG element 11 is inclined by $\pm\theta_P$ to the optical axis of the converging beam, as shown in FIG. 9. The angle $\theta_P$ is determined as follows in the same manner as in the first embodiment.

$$\theta_P = \tan^{-1}(y_2/2f_5) = 6.6°$$

The exit direction of SHG light produced by the interaction on the SHG element 11 between the signal light and probe light is a direction of a vector obtained by adding a traveling direction vector of signal light and a traveling direction vector of probe light. The traveling direction of signal light is constant but the traveling direction of probe light has a spread of angle ($\pm\theta_P$). Therefore, the SHG light has a spread of the exit direction from the SHG element 11. A spread angle ($\theta_D$) of SHG light can be calculated in the same manner as in the first embodiment. The SHG light leaves the SHG element 11 in the range of angle $\theta_D = \pm3.3°$.

Since $\theta_S=10°$ and $\theta_P=6.6°$,
$\theta_S=10° > 3\theta_P/2 = 3\theta_D = 9.9°$.

Thus, this example satisfies the condition of Equation (6), obviating a filter or the like for separating the SHG light from the signal light and the probe light.

The SHG light is collimated by the convex lens 32 (focal length ($f_{32}$)=200 [mm]) to convert the directional spread into a spatial spread. The thus obtained beam spread ($y_1$) is as follows.

$$y_1 = 2f_3 \tan 3.3° = 23.0 \text{ [mm]}$$

The collimated SHG light is measured by the photodetector 22. There are SHG light pulses carrying eight bit data at equal intervals in $y_1=23.0$ [mm]. Thus, whether SHG light is present or absent is judged by the APD array photodetector 22 having eight avalanche photodiodes arranged at intervals of 23 [mm]/7=3.3 [mm], whereby "0" or "−1" of each digital data bit is determined.

The intensity of SHG light outgoing from the SHG element 11 is proportional to the intensity of signal light in the present embodiment, similarly as in the first embodiment of optical serial-parallel converter. Therefore, the SN ratio may be improved in measurement by optically amplifying the signal light on the way of wave guide to the vicinity of SHG element 11. FIG. 4 shows an example of the amplification of signal light, in which a semiconductor optical amplifier (TWA) 72 is provided between optical fibers 71 and 73 for guiding the signal light. The optical amplifier may be an Er-doped optical fiber amplifier or an optical parametric amplifier.

The parallelized bit width can be increased if the spatial distribution of probe light exit position is not one-dimensional but two-dimensional and if the photodetector is two-dimensional.

The intensity of the SHG light emission becomes higher as the product between the energy of the signal light pulse and energy of the probe light pulse interact with each other increases. Thus, an overlapping time is preferably as long as possible at the interacting point between the signal light pulse and the probe light pulse. For this purpose, the delay times of electric signal delay circuits $422_1$–$422_7$ may be adjusted as to maximize the output amplitude of photodetector 22. The arrival time of signal light at the interaction point may be adjusted for the same purpose.

Third Embodiment of Optical Serial-Parallel Converter

Figure 11:
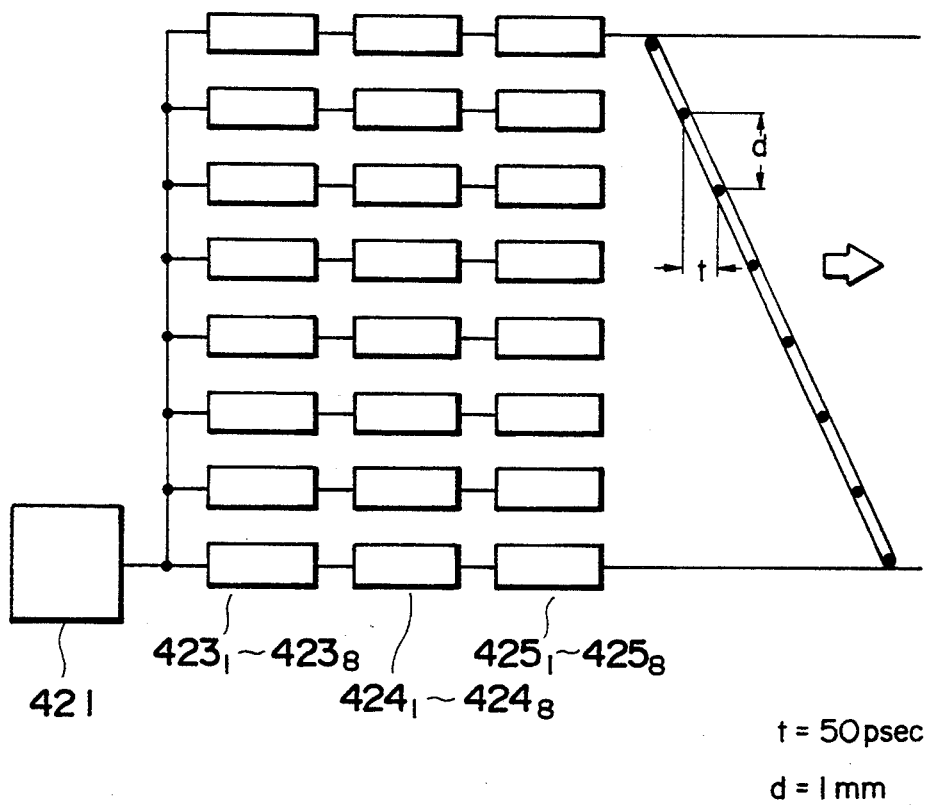
FIG. 11 is a drawing showing a probe light pulse emitter for an optical serial-parallel converter in the third embodiment according to the present invention.

The construction of the present embodiment is identical to that of the second embodiment of the optical serial-parallel converter except for the pulse emitter for probe light. FIG. 11 shows the structure of light source for probe light in the present embodiment. The light source for probe light is constituted by a reference clock generator 421 (cycle=400 [psec]), eight comb generators $423_1$–$423_8$ for receiving a pulse generated by the reference clock generator to produce short pulses of several 10 [psec], eight laser diodes $424_1$–$424_8$ driven at the same timing by the output pulses from the comb generators, and eight optical delay circuits $425_1$–$425_8$ for delaying the pulses from the laser diodes for one after another by 50 [psec].

The probe light generating means as so arranged produces the probe light similar to that by the probe light generating means in the second embodiment of the optical serial-parallel converter, so that digital information carried on signal light may be recognized by judging whether SHG light is received or not in each light detection unit.

Fourth Embodiment of Optical Serial-Parallel Converter

Figure 12:
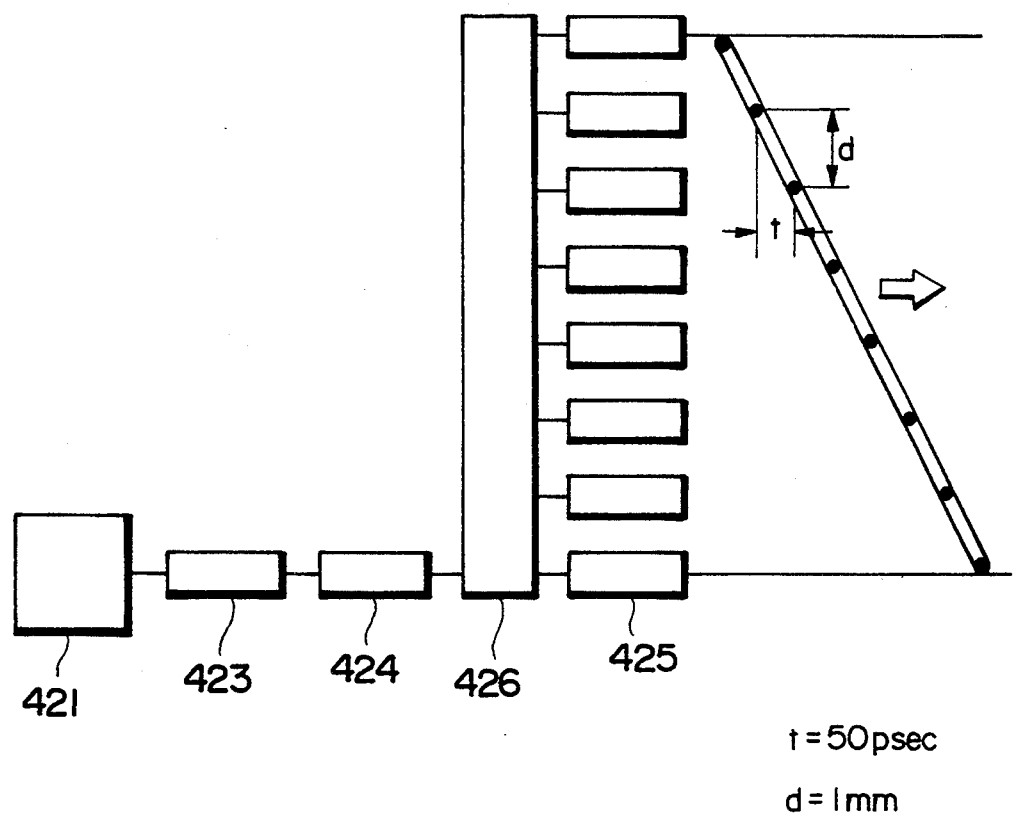
FIG. 12 is a drawing illustrating a probe light pulse emitter for an optical serial-parallel converter in the fourth embodiment according to the present invention.

The construction of the present embodiment is identical to that in the second embodiment of the optical serial-parallel converter except for the pulse emitter for probe light. FIG. 12 shows the construction of probe light generating means in the present embodiment. The probe light generating means is constituted by a reference clock generator 421 (cycle=400 [psec]), a comb generator 423 for receiving a pulse generated by the reference clock generator to produce a short pulse of several 10 [psec], a laser diode 424 driven by the output pulse from the comb generator, a splitting device 426 for splitting the pulse from the laser diode into eight pulses, and eight optical delay circuits $425_1$–$425_8$ for delaying the pulses by 50 [psec] for one after another.

The probe light generating means as so arranged produces the probe light similar to that by the probe light generating means in the second embodiment of optical serial-parallel converter, so that digital information carried on signal light may be recognized by judging whether SHG light is received or not in each light detection unit.

Fifth Embodiment of Optical Serial-Parallel Converter

Figure 13:
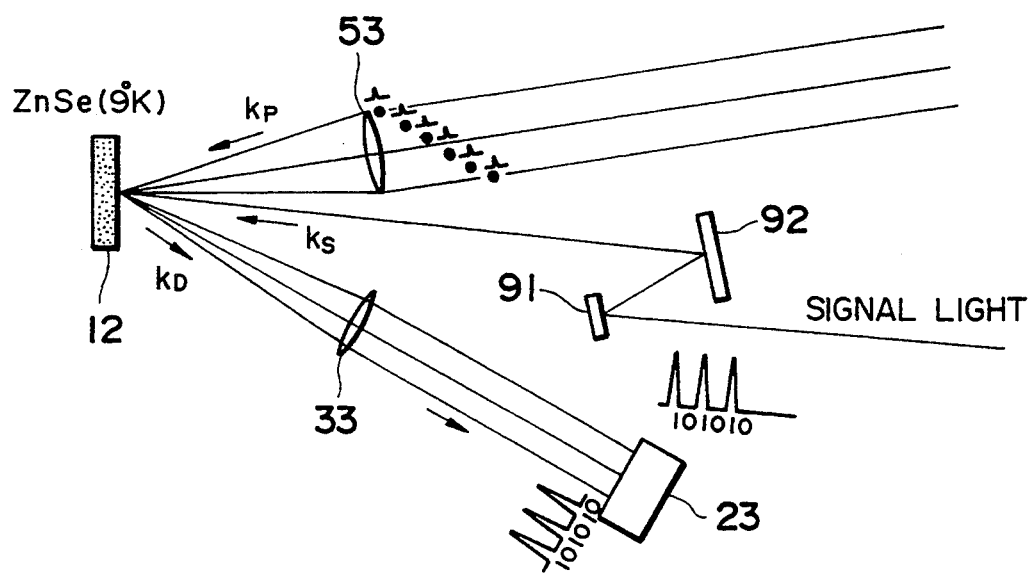
FIG. 13 is a drawing depicting a fifth embodiment of an optical serial-parallel converter according to the present invention.

FIG. 13 shows the basic construction of the fifth embodiment of optical serial-parallel converter. This embodiment employs the third-order nonlinear effect, different from the first-fourth embodiments of optical serial-parallel converters as described above. The apparatus of this embodiment has the same structure as the third embodiment of light waveform measuring apparatus and is operated in a similar manner.

In the present embodiment four-waves-mixed light of reflection type having an exit direction ($k_D$) from ZnSe crystal as expressed by the following equation is measured out of four-waves-mixed light, in the same manner as in the third embodiment of light waveform measuring apparatus.

$$k_D = -(2k_P - k_S)$$

where $k_D$: a traveling direction vector of four-waves-mixed light;
$k_P$: a traveling direction vector of probe light;
$k_S$: a traveling direction vector of signal light.

As is apparent from this equation, the exit direction of four-waves-mixed light from the ZnSe crystal element, which is measured by the photodetector 23, changes depending upon the traveling direction of the probe light. Thus, digital information carried on signal light may be recognized by judging whether mixed light is received or not in each light detection unit in the same manner as the first to fourth embodiments of optical serial-parallel converters. The amplifier of signal light, or the two dimensional arrangement of probe light and the photodetector 23, as described in the second embodiment of optical serial-parallel converter, can be applied to the present embodiment with the same effect.

Since most of media having the second-order nonlinear optical effect also has the third-order nonlinear optical effect, such media may be also used as the nonlinear element having the third-order nonlinear optical effect in the present embodiment.

The present invention is not limited to the embodiments as described above, but may have many different modifications.

For example, a CCD camera can be used as the photodetector as well as the photodiode array and the avalanche photodiode array as described. To obtain the probe light beams having different incident angles into nonlinear element depending upon the arrival time to irradiate the nonlinear element, an alternative arrangement may be such that a light pulse is guided through an optical fiber which causes chirp on the light pulse by the self phase modulation and causes linear chirp by using the effect of group velocity dispersion at the same time, that the light pulse is guided to pass through a spectral element such as a diffraction grating, and that outgoing light therefrom is converged by a convex lens.

The light source of probe light may be a solid laser, a dye laser or a gas laser in place of the semiconductor laser diode as described.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. An optical converter comprising:
   a nonlinear element for making two types of light interact with each other so as to cause nonlinear optical effect;
   means for guiding light to be measured to said nonlinear element; and
   light generating means for generating probe light crossing said light to be measured on said nonlinear element and changing a traveling direction with a time of crossing;
   wherein light is produced by interaction between said light to be measured and said probe light in said nonlinear element and the thus produced light leaves said nonlinear element in a traveling direction changing with time.

2. An optical converter according to claim 1, wherein said light generating means identifies arrival of measurement-intended portion in said light to be measured at said nonlinear element and emits said probe light in synchronism with the arrival, whereby said probe light and the measurement-intended portion in said light to be measured reach said nonlinear element at the same time.

3. An optical converter according to claim 2, wherein said light generating means comprises:
   a light source emitting short pulse light having a predetermined time width shorter than a time spread of the measurement-intended portion in said light to be measured and having a spatial spread normal to the traveling direction thereof;
   a diffraction grating for receiving the short pulse light emitted from said light source and providing by diffraction diffracted light with a spatial spread of said short pulse light being inclined to the traveling direction thereof; and
   a condenser for converging said diffracted light in the vicinity of a point in the nonlinear element where said diffracted light is to interact with said light to be measured.

4. An optical converter according to claim 3, wherein said condenser comprises either one of a convex lens and a concave mirror.

5. An optical converter according to claim 2, wherein said light generating means comprises:
   a light source for emitting short pulse light having shorter time width than a time spread of the measurement-intended portion in said light to be measured;
   means for moving said light source without changing a direction of light emission thereof but with change in position in a direction normal to said direction of light emission;
   means for controlling an emission timing of the short pulse light from said light source, based on detection of arrival of the measurement-intended portion in said light to be measured and in accordance with a light emission position of said light source; and
   a deflector for giving the short pulse light emitted from said light source an incident angle into said nonlinear element, specific to each pulse.

6. An optical converter according to claim 5, wherein said deflector comprises either one of a convex lens and a concave mirror.

7. An optical converter according to claim 2, wherein said light generating means comprises:

a plurality of light sources one-dimensionally arranged, for generating light pulses having time widths shorter than a time spread of the measurement-intended portion in said light to be measured and being substantially parallel to each other in the traveling direction thereof;

means for controlling an emission timing of said light pulses from said plurality of light sources, based on detection of arrival of the measurement-intended portion in said light to be measured and in accordance with a location of each light source; and a deflector for giving said light pulses emitted from each of said plurality of light sources an incident angle into said nonlinear element, specific to each said light pulse.

8. An optical converter according to claim 7, wherein said deflector comprises either one of a convex lens and a concave mirror.

9. An optical converter according to claim 2, wherein said light generating means comprises a plurality of light sources which can be driven independent of each other, each light source projecting a pulse toward a point of interaction on said nonlinear element and wherein said each light source sequentially repeats exclusive light emission in synchronism with said light to be measured at a period of a predetermined cycle multiplied by the number of light sources and for a time within said predetermined cycle, pulse light emission intervals of said light sources are delayed by the same time as said predetermined cycle for every one after another, and the pulses emitted from said light sources are given incident directions different from each other into a point of interaction on said nonlinear element.

10. An optical converter according to claim 9, further comprising a condenser for converging the pulses emitted from said light sources at the point of interaction on said nonlinear element.

11. An optical converter according to claim 10, wherein said condenser comprises either one of a convex lens and a concave mirror, which gives the pulses incident directions different from each other into the point of interaction on said nonlinear element.

12. An optical converter according to claim 2, wherein said light generating means comprises a plurality of light sources which can be driven independent of each other, each light source projecting a pulse toward a point of interaction on said nonlinear element, and a plurality of delay devices for giving different time delays to the respective pulses emitted from said light sources, wherein said plurality of light sources are driven to emit the pulses at a period of a predetermined cycle multiplied by the number of light sources and for a time within said predetermined cycle, and wherein the pulses emitted from said light sources are given incident directions different from each other into the point of interaction on said nonlinear element.

13. An optical converter according to claim 12, further comprising a condenser for converging the plurality of pulses emitted from said light sources at the point of interaction on said nonlinear element.

14. An optical converter according to claim 13, wherein said condenser comprises either one of a convex lens and a concave mirror, which gives the pulses the incident directions different from each other into the point of interaction on said nonlinear element.

15. An optical converter according to claim 2, wherein said light generating means comprises:

a light source;

a splitter for splitting light emitted from said light source to obtain a plurality of split pulses with similar timing;

a plurality of delay devices for giving said split pulses time delays different from pulse to pulse; and a condenser for causing said delayed split pulses to enter a point of interaction on said nonlinear element in different incident directions;

wherein said respective split pulses enter the point of interaction on said nonlinear element in synchronism with said light to be measured in different incident directions.

16. An optical converter according to claim 15, further comprising a condenser for converging said each said split pulse at said point of interaction on said nonlinear element.

17. An optical converter according to claim 16, wherein said condenser comprises either one of a convex lens and a concave mirror, which gives the split pulses the different incident directions into said point of interaction on said nonlinear element.

18. An optical converter according to claim 1, wherein said nonlinear element has either one of second-order and third-order nonlinear optical effect.

19. An optical converter according to claim 1, wherein said means for guiding light to be measured comprises means for amplifying said light to be measured.

20. An optical converter according to claim 1, further comprising means for detecting an intensity of output light produced by interaction between said light to be measured and said probe light in said nonlinear element.

21. An optical converter according to claim 20, wherein said means for detecting an intensity of output light comprises a plurality of detecting elements one-dimensionally arranged and has a resolution in an exit direction of said output light.

22. An optical converter according to claim 20, wherein said means for detecting an intensity of output light comprises a charge storage photodetector, which can store charge produced by reception of said output light.

23. An optical converter according to claim 20, wherein said means for detecting an intensity of output light is so arranged that a plurality of photodetectors each having a photo detecting element are located corresponding to the exit directions of said output light.

24. An optical converter according to claim 20, wherein said output light detecting means comprises a photodetector having a plurality of photo detecting elements, each element being arranged corresponding to an exit direction of said output light.

25. An optical converter according to claim 20, wherein an arrival time of probe light at the point of interaction on the nonlinear element is controlled as to maximize an intensity of received light by said detecting means.

* * * * *